(12) United States Patent
Sobue

(10) Patent No.: US 7,737,736 B2
(45) Date of Patent: Jun. 15, 2010

(54) INTERFACE CIRCUIT AND SIGNAL OUTPUT ADJUSTING METHOD

(75) Inventor: Toshiharu Sobue, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/073,698

(22) Filed: Mar. 7, 2008

(65) Prior Publication Data

US 2008/0218239 A1 Sep. 11, 2008

(30) Foreign Application Priority Data

Mar. 9, 2007 (JP) .............................. 2007-059955

(51) Int. Cl.
*H03K 3/00* (2006.01)
(52) U.S. Cl. ........................................ 327/108; 327/112
(58) Field of Classification Search ........................ None
See application file for complete search history.

(56) References Cited

U.S. PATENT DOCUMENTS 7,023,242 B2 * 4/2006 Brand et al. ................... 326/82
7,215,161 B2 * 5/2007 Nguyen ........................ 327/100
7,460,602 B2 * 12/2008 Clements et al. .............. 375/257
2004/0177286 A1 * 9/2004 Gauthier et al. ............... 713/401
2009/0108914 A1 * 4/2009 Zhang et al. ................... 327/517

FOREIGN PATENT DOCUMENTS

JP          06-216680       8/1994
JP          2000-049588 A   2/2000

* cited by examiner

*Primary Examiner*—Tuan Lam
*Assistant Examiner*—Hiep Nguyen
(74) *Attorney, Agent, or Firm*—Foley & Lardner LLP

(57) ABSTRACT

The problem to be solved by of this claimed application is solved by providing an interface circuit and a signal output adjusting method that are capable of adjusting amplitude of a transmission-side signal by taking attenuation of a transmission path into consideration. In a transmission-side circuit part of an interface circuit 100, a repetitive signal 111 having constant amplitude is sent out to a transmission path 123 through an output buffer circuit 117 that is configured of a CML circuit at the time of testing. In a reception-side circuit part 102, a determining circuit 135 compares the amplitude of the input signal 131 with each of a plurality of reference voltages $Vref_1$ to $Vref_n$ in comparators $132_1$ to $132_n$ to obtain a comparison result. And, a voltage controlling circuit 119 of a transmission-side circuit part 101 makes the setting of the amplitude by appropriately controlling a constant current value of the CML circuit, thereby enabling the low consumption power to be realized.

5 Claims, 2 Drawing Sheets

INTERFACE CIRCUIT AND SIGNAL OUTPUT ADJUSTING METHOD

INCORPORATION BY REFERENCE

This application is based upon and claims the benefit of priority from Japanese patent application No. 2007-059955 filed on Mar. 9, 2007, the disclosure of which is incorporated herein in its entirety by reference.

RELATED ART

The present invention relates to an interface circuit and a signal output adjusting method, and for example, to an interface circuit and a signal output adjusting method that are preferred at the time of using a CML circuit.

High-speed serial communication such as a USB (Universal Serial Bus) has been prosperously used between each of various information processing devices and the other, or between a personal computer and a peripheral appliance thereof.

A CML (Current Mode Logic) circuit has been mainly used for an output buffer of a high-speed interface circuit. The CML circuit, which assumes a circuit configuration in which a current is allowed to flow at any time, consumes a lot of power. Thus, an increase in the consumption power accompanied by an acceleration of communication becomes a serious subject of discussion.

Thereupon, the technique of suppressing an increase in the consumption power by monitoring a monitor output in the interface circuit using an ECL (Emitter Coupled Logic) circuit has been proposed as a first proposal (for example, see Patent document 1). In this first proposal, the monitor ECL output buffer circuit outside an LSI, which is representative of other ECL output buffer circuits, monitors a DC component by employing a low-pass filter. And it returns to the LSI a difference with a reference voltage given to the differential equipment, thereby to correct an output potential of an LSI reference voltage generating circuit.

As it is, the first proposal necessitates providing the monitor ECL output buffer circuit apart from the ECL output buffer circuit that is used for the original output. Thus, it follows that the consumption power is increased by the extent equivalent to this. Further, there exists the inherent problem that the adjustment cannot be made appropriately even though the output potential of the LSI reference voltage generating circuit is corrected in the monitor side if a difference of the characteristic exists between these ECL output buffer circuits.

Thereupon, the technique of detecting higher harmonic in output waves of an amplifier itself, inputting it into a comparator, comparing it with a higher harmonic allowable value, and controlling the amplifier responding to its comparison result has been proposed as a second proposal.

[Patent document 1] JP-P2000-049588A (No. 0013 paragraph, FIG. 1)

[Patent document 2] JP-P1994-216680A (No. 0005 paragraph, FIG. 1)

As it is, in the second proposal, the comparator is provided in a circuit identical to the amplifying circuit to make a comparison with the higher harmonic allowable value. Thus, this causes the problem that the control, in which attenuation of a transmission path that occurs at the time that the interface circuit inputs/outputs a signal via the transmission path is taken into consideration, cannot be taken. The first proposal as well causes the similar problem in that an influence by the transmission path cannot be taken into consideration.

SUMMARY OF THE INVENTION

Thereupon, an exemplary object of the present invention is to provide an interface circuit and a signal output adjusting method that enables amplitude of a transmission-side signal to be adjusted by taking attenuation of the transmission path into consideration.

This claimed invention allows an interface circuit to include: a transmission-side circuit including; an output buffer circuit for sending out a signal, which should be transmitted, to a transmission path; and an amplitude adjusting circuit for adjusting amplitude of a signal that is output from this output buffer circuit; and a reception-side circuit including: a comparator for, when a signal having amplitude that becomes a reference is input into the output buffer circuit, comparing the amplitude of the signal input through the transmission path with a predetermined reference value; and a determining circuit for determining a relation of magnitude between the amplitude of the signal input through the transmission path and the reference value based upon the comparison result, and outputting its determination result for a purpose of conveying it to the amplitude adjusting circuit.

This claimed invention allows a signal output adjusting method to include; a reference signal sending-out step of generating a reference signal of which amplitude is constant, and outputting this to a transmission path through an output buffer circuit at the time of testing; a amplitude comparison step of receiving this reference signal through the transmission path, and making a comparison as to whether its amplitude is in a range of a predetermined value, or whether its amplitude is larger or smaller than it; and an output buffer adjustment step of returning a comparison result obtained in this amplitude comparison step to the output buffer, and causing the output buffer to adjust the amplitude of the signal that is to be output from now on.

BRIEF DESCRIPTION OF THE DRAWINGS

This and other objects, features and advantages of the present invention will become more apparent upon a reading of the following detailed description and drawings, in which.

EXEMPLARY EMBODIMENTS

Hereinafter, the exemplary example of the present invention will be explained in details.

EXEMPLARY EXAMPLE 1

Figure 1:
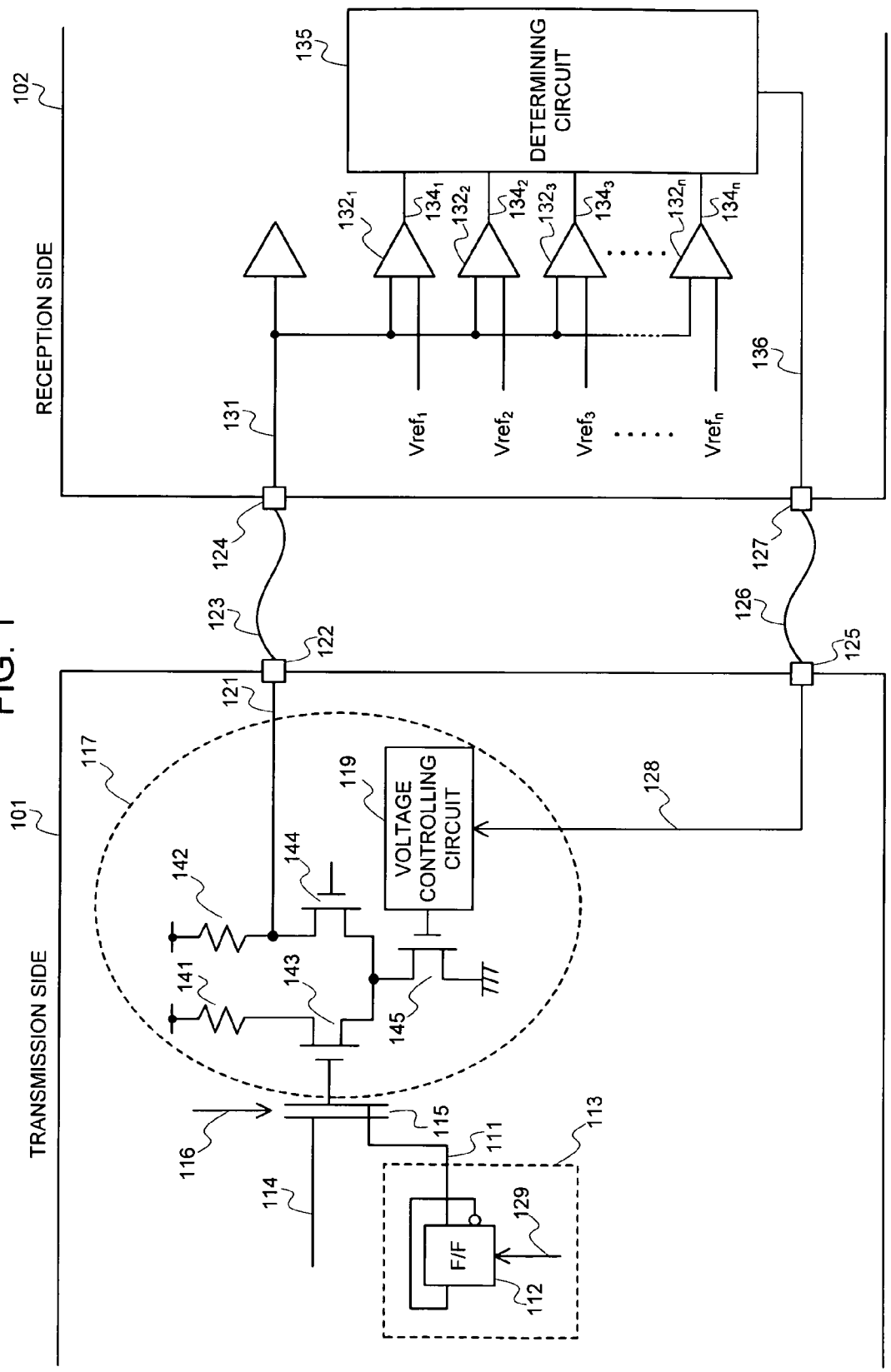
FIG. 1 is a circuit view illustrating an interface circuit in one exemplary example of the present invention.

FIG. 1 shows an interface circuit in one exemplary example of the present invention. An interface circuit 100 is configured of a transmission-side circuit part 101 and a reception-side circuit part 102.

The transmission-side circuit part 101 includes a signal generating circuit 113 configured of a flip-flop circuit 112 for generating a repetitive signal 111 having a basic frequency $F_0$, being a transmission signal. A configuration is made so that the repetitive signal 111, which is output from the signal generating circuit 113, and a normal data signal 114 are input into a selecting circuit 115, and one of them is supplied to an output-side output buffer circuit 117 by a switchover control signal 116. The output buffer circuit 117 as an output circuit is configured of a CML (Current Mode Logic) circuit. The output buffer circuit 117 includes a voltage controlling circuit 119 capable of changing a constant current value of this CML circuit.

An output signal 121 of the output buffer circuit 117 is adapted to be sent out to a first reception-side terminal 124 of the reception-side circuit part 102 via a transmission path 123 from a first transmission-side terminal 122 of the transmission-side circuit part 101. Further, a second transmission-side terminal 125 of the transmission-side circuit part 101 is connected to a second reception-side terminal 127 of the reception-side circuit part 102 via a transmission path 126. A voltage control signal 128 is adapted to be input into the voltage controlling circuit 119 from the second transmission-side terminal 125. Further, a clock signal 129 is adapted to be supplied to the flip-flop circuit 112 from a clock generating circuit that is not shown in the figure.

The reception-side circuit part 102 includes a first to an n-th comparators $132_1$ to $132_n$ for inputting an input signal 131 that is input from the first reception-side terminal 124, and comparing it with a first to an n-th reference voltages $Vref_1$ to $Vref_n$, respectively. A configuration is made so that a first to an n-th comparison results $134_1$ to $134_n$ of the first to the n-th comparators $132_1$ to $132_n$ are input into a determining circuit 135, in which a determination for the voltage control, of which a result is employed for the voltage control of the voltage controlling circuit 119 of the transmission-side circuit part 101, is made. A voltage control signal 136, which is output from the determining circuit 135, is output to the second reception-side terminal 127.

Herein, the output buffer 117 of this exemplary example is configured of a first and a second pull-up resistors 141 and 142, a first and a second FETs 143 and 144 correspondingly connected hereto one by one, and a third FET 145, being a constant current source for these first and second FETs 143 and 144. The voltage controlling circuit 119, which is connected to a gate of the third FET 145, is adapted to control its voltage. Further, an output of the selecting circuit 115 is adapted to be input into a gate of the first FET 143.

An operation of the interface circuit 100 of this exemplary example having such a configuration will be explained next.

The flip-flop circuit 112 of the transmission-side circuit part 101 inputs the clock signal 129, and generates the repetitive signal 111 having a basic frequency F0. This repetitive signal 111 is input into the selecting circuit 115. The repetitive signal 111 is selected responding to the switchover control signal 116, and is sent out to the transmission path 123 through the output buffer circuit 117 at a timing, for example, at the time of the testing in which the normal data signal 114 is not sent out.

In the reception-side circuit part 102, the input signal 131 input into the first reception-side terminal 124 via this transmission path 123 is supplied to one input terminal of the first to the n-th comparators $132_1$ to $132_n$. The first to the n-th comparators $132_1$ to $132_n$ compare the first to the n-th reference voltages $Vref_1$ to $Vref_n$ with the amplitude of the input signal 131, respectively. And, they output the first and the n-th comparison results $134_1$ to $134_n$ to the determining circuit 135, respectively.

Figure 2:
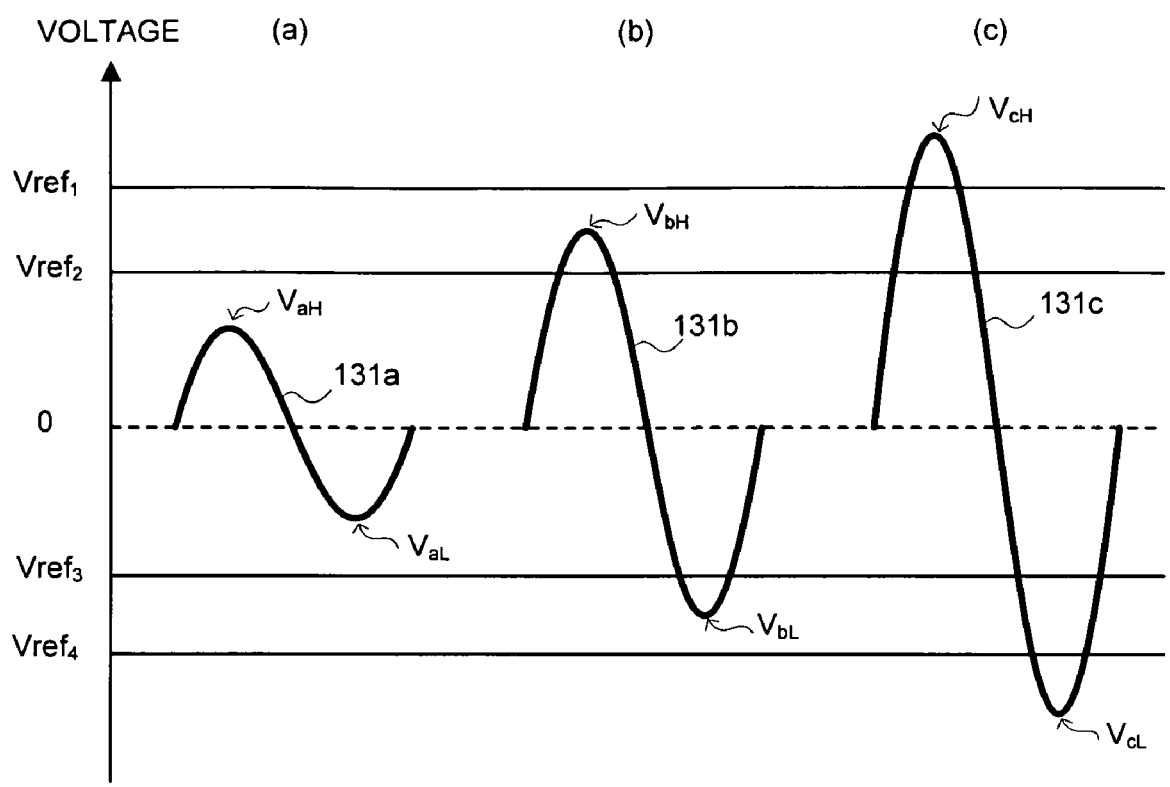
FIG. 2 is an explanatory view illustrating a relation between each of various amplitude levels of the input signals that are input into a reception-side circuit part and a reference voltage in this exemplary example.

FIG. 2 shows a relation between each of the various amplitude levels of the input signals that are input into the reception-side circuit part and a reference voltage. Herein, the case that the value "n" is "4" is shown, that is, the case of comparing each of the first to the fourth reference voltages $Vref_1$ to $Vref_4$ with the amplitude of the input signal 131 is shown. It is assumed that a waveform 131b shown in (b) of the same figure assumes ideal amplitude. With this desired waveform 131b, the first reference voltage $Vref_1$ and the second reference voltage $Verf_2$ are pre-set so that a maximum $V_{bH}$ of the amplitude is within a range of the next equation (1).

$$Vref_2 < V_{bH} < Vref_1 \quad (1)$$

Further, with the desired waveform 131b, the third reference voltage $Vref_3$ and the fourth reference voltage $Verf_4$ are pre-set so that a minimum $V_{bL}$ of the amplitude is within a range of the next equation (2).

$$Vref_4 < V_{bL} < Vref_3 \quad (2)$$

Upon doing so, when the waveform is a waveform of (b) of the same figure, it follows that the determination output of the first and the second comparators $132_1$ and $132_2$ becomes "01" with the maximum $V_{bH}$ of the amplitude, and the determination output of the third and the fourth comparators $132_3$ and $132_4$ becomes "01" with the minimum $V_{bL}$ of the amplitude. Thus, in this case, it follows that a signal "0101" is input into the determining circuit 135 as the first to the fourth comparison results $134_1$ to $134_4$.

On the other hand, it is assumed that a waveform 131a having small amplitude such that a maximum $V_{aH}$ of the amplitude is the second reference voltage $Vref_2$ or less, and a minimum $V_{aL}$ thereof is the third reference voltage $Vref_3$ or more, as shown in (a) of the same figure, is transmitted from the transmission side 101. In this case, the determination output of the first and the second comparators $132_1$ and $132_2$ becomes "00" with the maximum $V_{aH}$ of the amplitude. Further, the determination output of the third and the fourth comparators $132_3$ and $132_4$ becomes "11" with the minimum $V_{bL}$ of the amplitude. Thus, in this case, it follows that a signal "0011" is input into the determining circuit 135 as the first to the fourth comparison results $134_1$ to $134_4$.

Further, it is assumed that a waveform 131c having large amplitude such that a maximum $V_{cH}$ of the amplitude of its waveform exceeds the first reference voltage $Vref_1$, and a minimum $V_{cL}$ thereof falls bellow the fourth reference voltage $Vref_4$, as shown in (c) of the same figure, is transmitted from the transmission side 101. In this case, the determination output of the first and the second comparators $132_1$ and $132_2$ become "11" with the maximum $V_{cH}$ of the amplitude. Further, the determination output of the third and the fourth comparators $132_3$ and $132_4$ becomes "00" with the minimum $V_{cL}$ of the amplitude. Thus, in this case, it follows that a signal "1100" is input into the determining circuit 135 as the first to the fourth comparison results $134_1$ to $134_4$.

Thus, the determining circuit 135 can determine whether the input signal 131 is at an appropriate amplitude level, or whether the input signal 131 has the amplitude smaller or larger than the appropriate amplitude from a bit row of the first to the n-th comparison results $134_1$ to $134_n$, which is input as the first to the n-th comparison results $134_1$ to $134_n$. When the value "n" is larger than "4", the situation of the amplitude can be determined in yet more details.

The determining circuit 135 outputs the voltage control signal 136 for feedbacking the above determination result to the output buffer circuit 117 via the voltage controlling circuit 119. That is, as exemplified by the case of using the first to the fourth reference voltages $Vref_1$ to $Vref_4$, the voltage control signal 136 becomes a signal for keeping the current status when the signal "0101" indicating that the amplitude is appropriate is input into the determining circuit 135. Further, the voltage control signal 136 becomes a signal for giving an instruction for enlarging the amplitude so that it is larger than the current one when the signal "0011" corresponding to the waveform 131a having small amplitude is input into the determining circuit 135. In addition hereto, the voltage control signal 136 becomes a signal for giving an instruction for lessening the amplitude so that it is smaller than the current one when the signal "1100" corresponding to the waveform 131c having large amplitude is input into the determining circuit 135.

As a result of such a control being taken through the voltage controlling circuit 119, the constant current value of the CML circuit constituting the output buffer circuit 117 can be appropriately controlled, thereby enabling the setting to be made so that the amplitude of the input signal 131 in the reception-side circuit part 102 becomes a desirable value.

In such a manner, the amplitude level of the output signal 121 of the CML circuit constituting the output buffer circuit 117 was adjusted in the interface circuit 100 of this exemplary example. Thus, it becomes possible to making the setting so that the amplitude of the input signal 131 in the reception-side circuit part 102 becomes a requisite minimum irrespective of the attenuation of the output signal 121 that is output to the transmission path 123 from the transmission-side circuit part 101.

The attenuation quantity of the transmission path 123 governs the amplitude of the signal at the moment that it is input into the reception-side circuit part 102. Thereupon, normally, on the assumption that the transmission path 123 connecting the transmission-side circuit part 101 and the reception-side circuit part 102 becomes longest, that is, on the assumption that the attenuation quantity of the signal becomes maximized, the amplitude of the signal of the output buffer is set so that also in this case, the output signal 121 of the CML circuit can be received.

For this, when the actual transmission path 123 is shorter than was envisaged, the attenuation quantity of the signal becomes smaller, so the amplitude thereof becomes larger than a requisite minimum. Thereby, the consumption power for the constant current value of the CML circuit cannot be lessened, that is, the CML circuit of which the power consumption is low cannot be realized. In this exemplary example, the constant current value of the transmission-side CML circuit can be lessened to the extent at which the amplitude of the signal in the reception side becomes a requisite minimum. Thus, making a switchover to transmission of the normal data signal 114 with the switchover control signal 116 at the time point of having finished the setting of the amplitude of the signal of the output buffer circuit 117 enables the CML circuit of which the power consumption is low to be realized.

Additionally, needless to say, various modifications to the specific circuit configuration of the output buffer circuit 117 in the interface circuit 100 explained above can be made. Further, a signal format of the voltage control signal 136 as well that is output from the determining circuit 135 is not limited to one explained in the exemplary example.

While the invention has been particularly shown and described with reference to exemplary examples thereof, the invention is not limited to these exemplary examples. It will be understood by those of ordinary skill in the art that various changes in form and details may be made therein without departing from the spirit and scope of the present invention as defined by the claims.

As explained above, an interface circuit of the present invention comprising: a transmission-side circuit including; an output buffer circuit for sending out a signal, which should be transmitted, to a transmission path; and an amplitude adjusting circuit for adjusting amplitude of a signal that is output from this output buffer circuit; and a reception-side circuit including: a comparator for, when a signal having amplitude that becomes a reference is input into the output buffer circuit, comparing the amplitude of the signal input through the transmission path with a predetermined reference value; and a determining circuit for determining a relation of magnitude between the amplitude of the signal input through the transmission path and the reference value based upon the comparison result, and outputting its determination result for a purpose of conveying it to the amplitude adjusting circuit.

That is, in the present invention, by inputting the signal having the amplitude that becomes a reference into the output buffer circuit to transmit it to the reception-side circuit through the transmission path, comparing the amplitude of the received in the reception-side circuit with the predetermined reference value to determine its magnitude, and conveying its result to the amplitude adjusting circuit, a feedback control is enabled.

Herein, the output buffer circuit may be configured of the CML circuit. In this case, it is enough that the amplitude adjusting circuit is a voltage controlling circuit capable of changing a constant current value of this CML circuit.

Further, the determining circuit is hardly influenced by attenuation of the signal of the transmission path at the moment of taking a feedback control so long as it is a circuit for determining whether the amplitude is within a appropriate value, or whether the amplitude is larger or smaller than it from the comparison result of the comparator making a comparison with each of a plurality of thresholds for the amplitude, and outputting a digital signal indicating this determination result for a purpose of conveying it to the amplitude adjusting circuit.

Further, a signal output adjusting method of the present invention including: a reference signal sending-out step of generating a reference signal of which amplitude is constant, and outputting this to a transmission path through an output buffer circuit at the time of testing; a amplitude comparison step of receiving this reference signal through the transmission path, and making a comparison as to whether its amplitude is in a range of a predetermined value, or whether its amplitude is larger or smaller than it; and an output buffer adjustment step of returning a comparison result obtained in this amplitude comparison step to the output buffer, and causing the output buffer to adjust the amplitude of the signal that is to be output from now on.

That is, the present invention is configured so that the reference signal of which the amplitude is constant is sent out to the transmission path through the output buffer circuit at the time of testing, the amplitude of the reference signal received in the amplitude comparison step is investigated, the comparison result obtained in the amplitude comparison step is returned to the output buffer for a purpose of making the correction that corresponds to attenuation of the signal that actually occurs, and the amplitude of the signal that is to be output from now on is adjusted.

Herein, in a case where the output buffer circuit is configured of the CML circuit, making a comparison as to whether the amplitude is a requisite minimum in the amplitude comparison step enables power saving to be realized.

As explained above, in accordance with the present invention, even though the attenuation quantity based upon the relative length etc. of the transmission path varies for each individual communication system, this can be simply adjusted because the amplitude of the signal having passed through the transmission path is actually investigated and its investigation result is feedback to the transmission side. In particular, in a case of employing the CML circuit, the constant current value of the output buffer circuit can be changed so that the amplitude of the reference signal transmitted from the transmission side becomes a requisite minimum at the moment that it is input into the reception side, which can contribute to the power saving.

What is claimed is:

1. An interface circuit comprising:
   a transmission-side circuit: including
   a selecting circuit for switching between inputting a normal data signal and a repetitive signal from a signal generating circuit based on a switchover control signal;
   an output buffer circuit for receiving the repetitive signal from the selecting circuit and outputting an output signal, to be input into and transmitted through a transmission path; and
   an amplitude adjusting circuit for adjusting an amplitude of said output signal that is output from said output buffer circuit; and
   a reception-side circuit: including:
   a comparator for comparing an amplitude of the output signal input into and transmitted through said transmission path with a predetermined reference value; and
   a determining circuit for determining a relation of magnitude between the amplitude of the output signal input into and transmitted through said transmission path and the reference value based upon said comparison result, and outputting a determination result of said determining circuit so that the result is conveyed to said amplitude adjusting circuit.

2. The interface circuit according to claim 1, wherein said output buffer circuit is configured to be a CML (Current Mode Logic) circuit, and said amplitude adjusting circuit is a voltage controlling circuit capable of changing a constant current value of said CML circuit.

3. The interface circuit according to claim 1, wherein said determining circuit is a circuit for determining whether the amplitude of the output signal input into and transmitted through said transmission path is within an appropriate value, or whether the amplitude of the output signal input into and transmitted through said transmission path is larger or smaller than the appropriate value from a comparison result of said comparator making a comparison with each of a plurality of thresholds for the amplitude of output the signal input into and transmitted through said transmission path, and outputting a digital signal indicating this determination result so that the result is conveyed to said amplitude adjusting circuit.

4. A signal output adjusting method comprising:
   a switching step of switching from inputting a normal data signal to a generated repetitive signal of which the amplitude is constant at a time of testing;
   a signal sending-out step of generating a buffer circuit signal via an output buffer circuit based on the generated repetitive signal, and outputting the buffer circuit signal so that it passes through a transmission path from the output buffer circuit at the time of testing;
   an amplitude comparison step of receiving the buffer circuit signal which has passed through said transmission path, and making a comparison as to whether an amplitude of the signal which has passed through said transmission path is in a range of a predetermined value, or whether the amplitude of the signal which has passed through said transmission path is larger or smaller than a predetermined value; and
   an output buffer adjustment step of returning a comparison result obtained in the amplitude comparison step to said output buffer circuit, and causing the output buffer circuit to adjust the amplitude of the buffer circuit signal that is to be output from now on.

5. The signal output adjusting method according to claim 4, wherein said output buffer circuit is configured to be a CML (Current Mode Logic) circuit, and said amplitude comparison step is a step of making a comparison as to whether said amplitude of the buffer circuit signal which has passed through said transmission path is a requisite minimum.

* * * * *